United States Patent
Ghosh et al.

(10) Patent No.: US 7,745,340 B2
(45) Date of Patent: Jun. 29, 2010

(54) METHOD OF CLEARING ELECTRICAL CONTACT PADS IN THIN FILM SEALED OLED DEVICES

(75) Inventors: Amalkumar P. Ghosh, Fishkill, NY (US); Yachin Liu, Rochester, NY (US); Hua Xia Ji, Wappingers Falls, NY (US)

(73) Assignee: Emagin Corporation, Hopewell Junction, NY (US)

( * ) Notice: Subject to any disclaimer, the term of this patent is extended or adjusted under 35 U.S.C. 154(b) by 0 days.

(21) Appl. No.: 11/169,154

(22) Filed: Jun. 27, 2005

(65) Prior Publication Data

US 2006/0051951 A1    Mar. 9, 2006

Related U.S. Application Data

(60) Provisional application No. 60/583,158, filed on Jun. 26, 2004.

(51) Int. Cl.
*H01L 21/302*    (2006.01)
*H01L 21/461*    (2006.01)

(52) U.S. Cl. ............... 438/708; 438/82; 438/99; 438/780; 257/E21.523; 257/E21.59

(58) Field of Classification Search ............ 438/57, 438/99, 82, 612, 707, 708, 780, 944, FOR. 117, 438/FOR. 118, FOR. 170; 257/40, 642, E39.007, 257/E51.001, E51.013, E51.018, E51.022, 257/E21.523, E21.59
See application file for complete search history.

(56) References Cited

U.S. PATENT DOCUMENTS

| 5,194,548 | A  | * | 3/1993  | Yoshimura     | 526/285 |
|-----------|----|---|---------|---------------|---------|
| 5,904,859 | A  | * | 5/1999  | Degani        | 216/18  |
| 6,587,573 | B1 | * | 7/2003  | Stam et al.   | 382/104 |
| 2002/0153523 | A1 | * | 10/2002 | Bernius et al. | 257/40 |
| 2003/0209979 | A1 | * | 11/2003 | Guenther et al. | 313/512 |
| 2005/0248260 | A1 | * | 11/2005 | Sellars et al. | 313/500 |

* cited by examiner

*Primary Examiner*—Matthew Smith
*Assistant Examiner*—Quovaunda Jefferson
(74) *Attorney, Agent, or Firm*—Robert L. Epstein; Epstein Drangel Bazerman & James, LLP

(57) ABSTRACT

A process of cleaning wire bond pads associated with OLED devices, including the steps of depositing on the wire bond pads one or more layers of ablatable material, and ablating the one or more layers with a laser, thereby exposing a clean wire bond pad.

1 Claim, 2 Drawing Sheets

Various layers on the wire bond pads that are ablated away using excimer laser

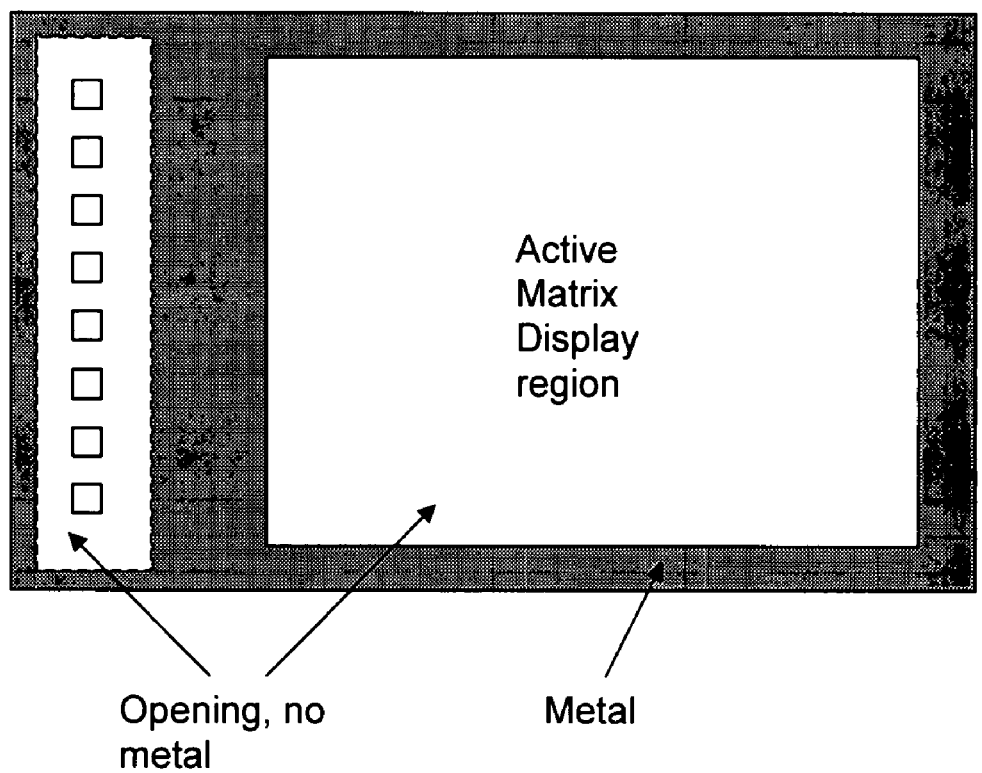
Figure 1: Metal shadow mask

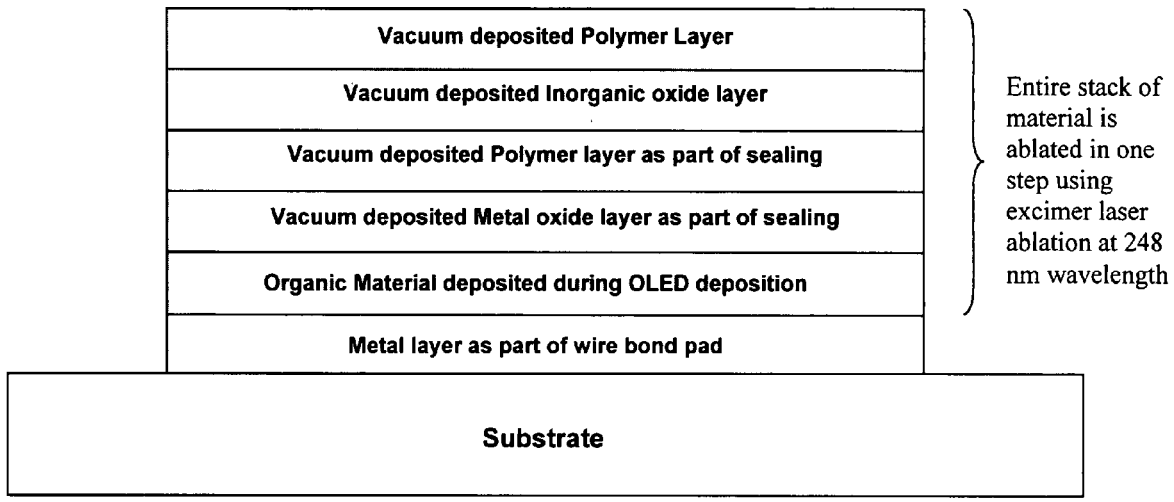
Figure 2: Various layers on the wire bond pads that are ablated away using excimer laser
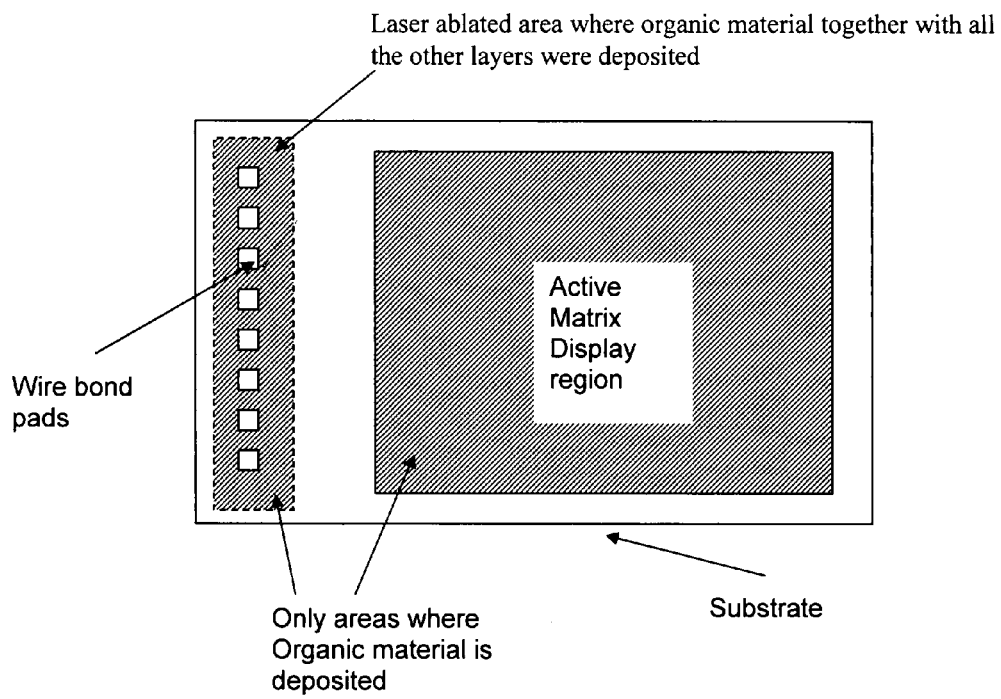
Figure 3: Laser ablated areas shown by hatched lines

METHOD OF CLEARING ELECTRICAL CONTACT PADS IN THIN FILM SEALED OLED DEVICES

CROSS-REFERENCE TO RELATED APPLICATIONS

This application claims the priority of U.S. Provisional Application 60/583,158, filed 26 Jun. 2004.

STATEMENT REGARDING FEDERALLY SPONSORED RESEARCH OR DEVELOPMENT

Not Applicable

REFERENCE TO A "SEQUENCE LISTING", A TABLE, OR A COMPUTER PROGRAM LISTING APPENDIX SUBMITTED ON COMPACT DISC

Not Applicable

BACKGROUND OF THE INVENTION

1. Field of the Invention

This invention is in the field of manufacturing and providing OLED devices and similarly fabricated devices.

The present invention relates to making OLED devices on a substrate. More specifically, it relates to making OLED device on substrate, which may be silicon or other suitable substrate, in part by using an ablation technique to clear electrical contact pads.

2. Description of Prior Art Including Information Disclosed Under 37 CFR 1.97 and 1.98

The applicant is presently unaware of any such prior art.

BRIEF DESCRIPTION OF THE DRAWINGS

FIG. 1 is a diagram showing layers of a device in accordance with the present invention.

FIG. 2 is a diagram of the device of FIG. 1, with incident UV laser light, in accordance with the present invention.

FIG. 3 is a diagram illustrating an alternative to that illustrated in FIGS. 1 & 2.

DETAILED DESCRIPTION OF THE PRESENTLY PREFERRED EMBODIMENTS

As is well-known to those of ordinary skill in the art, in thin film sealed OLED devices, good electrical contact must be made with the electrical contact pads, e.g. wire bond pads. Such pads are typically covered by the thin film seal materials, thus impeding electrical contact; this occurs because these materials are laid down as blanket films. It would be desirable to open up/expose ("clean") these electrical contact pads for proper electrical connection.

OLED devices sealed with thin film seal material are typically covered with that material through the device, including its electrical contact pads; this impedes electrical contact. In active matrix OLEDs these contact pads are actually the wire bond pads and are typically made of aluminum, which is vulnerable to attack by most chemicals, such as those which would be used in a liquid etching (cleaning) of the wire bond pads.

It is desirable to clean the wire bond pads via a single step dry process, preferably by using a directed energy source, e.g. a laser, such as an excimer laser.

The device in question typically comprises a laminar structure, with a thin film seal containing layers of inorganic and/or organic materials, typically deposited in blanket unpatterned form and covering the wire bond pads.

In accordance with the present method, no acid etch is needed, and the cleaning of the wire bond pads is accomplished via a dry process without the use of wet chemicals. The process comprises the following steps:

1. Prior to OLED deposition a photolithography patterning process is performed to selectively put photoresist over only the wire bond pads and nowhere else (See FIG. 1).
2. OLED deposition is carried out in the usual fashion, in any one of the many manners known to those of ordinary skill in the relevant art. (See FIG. 1). An example would be high vacuum evaporation method for small molecule.
3. The deposition of one or more thin film encapsulation layers is made over the entire wafer surface. The thin film encapsulation layer (which may comprise metal oxides, or nitrides, deposited by a method such as ALD) should most preferably sufficiently adhere to the photoresist surface covering the wire bond pad, so that the thin film encapsulation layer over the photoresist is strong enough to undergo subsequent processing without further damage to the entire structure.
4. Patterning of color filters is next performed, via a photolithography process which is carried out one layer at a time, usually for at least R, G and B layers, and sometimes for an additional black layer which puts black between the color pixels. (This step is more fully described in U.S. patent application Ser. Nos. 09/860,155 and 09/784,378, which are commonly owned with the present application and which are hereby incorporated by reference.)
5. Deposition of any additional protection layers may then be made, in a manner similar to that previously described, if additional protection is desired. (See FIG. 1)
6. Laser ablation process is executed (see FIG. 2), a process which comprises providing an incident beam of directed energy radiation to an area at least equal to, and preferably larger than, the area of the wire bond pad to be cleaned. Typically, the wire bond pad has over it a photoresist layer which is covered by layers comprising a protective polymer layer (e.g. parylene), which is covered by a layer or layers comprising an inorganic material, e.g. an oxide such as $SiO_2$., or a suitable nitride or other material. (Hereinafter the inorganic material may sometimes be referred to simply as an oxide, for exemplary purposes, it being understood that an oxide is but one example of a suitable material. Similarly, hereinafter the protective polymer layer may sometimes be referred to simply as parylene, it being understood that parylene is but one example of a suitable material. Typically, the incident beam will pass transparently through the inorganic layer, then will be absorbed by parylene, which will absorb energy from the beam, and then ablate, "blasting off" the layer of parylene and any layer above it. The next pulse of the laser will reach the photoresist and be absorbed by it, which will absorb energy from the beam, and then ablate, "blasting off" the layer of photoresist and exposing the thereby removing the parylene, and finally absorbed strongly by the photoresist, which is caused to undergo a mini-explosion which "blows off" from the wire bond pad both the photoresist and the ALD film—leaving only the exposed wire bond pad. The wavelength of the laser used for ablation can be 193 nm, 248 nm, 308 nm, i.e. any of the excimer laser wavelengths. Ablating a single layer may require on the order of 5 to 100 pulses of the laser. The fluence used for a laser ablation process can be very high (e.g. typically 0.25 to 2.0 Joules per square centimeter.

In an alternative to the above (see FIG. 3), the wire bonds may not be protected by a photoresist pattern, and during OLED deposition the organic layers can be shadow masked in such a way that in addition to the active areas receiving the organic layers the wire bond pads can also receive the layers. In this alternative, the wire bond pads receive patterned organic material over which the thin film seal layers will be laid down and laser ablation can remove all the layers (including the OLED organic layers). Note that while this alternative process is desirable inasmuch as it eliminates one photolithography step, it requires a high precision shadow mask for the wire bond openings (about 75 microns holes).

It should be noted in connection with this process that damage can result due to the proximity of the ESD protection diodes in the silicon to the wire bond pads (about 10 micrometers from the edge of the pad). This proximity can create the possibility for a problem since the fluence used for a laser ablation process can be very high (e.g. typically 0.25 to 2.0 Joules per square centimeter), and can permanently damage the diodes. Therefore, a metal pad may, at (or near) the same process step as the anode metal, be positioned such that it is essentially underlying the entire structure, which is especially important below the wire bond pads, to block the laser light from penetrating into the silicon devices.

What is claimed is:

1. A process of cleaning wire bond pads associated with OLED devices formed on a substrate using a shadow mask wherein the shadow mask has openings adapted to align with the active matrix display region and the wire bond pad region, the method comprising the steps of (a) depositing a conductive layer on a substrate; (b) placing the shadow mask over the conductive layer; (c) depositing an organic material layer on the conductive layer through the openings in the shadow mask to form an OLED pattern on the conductive layer in the active matrix display region and cover the wire bond pad region; (d) removing the shadow mask; forming a thin film encapsulation layer over substantially the entire surface of the wafer; and applying a laser beam to the wire bond pad region of the wafer so as to remove the organic material and all layers above same to expose the wire bond pads.

* * * * *